(12) United States Patent
Hildebrant et al.

(10) Patent No.: US 6,806,771 B1
(45) Date of Patent: Oct. 19, 2004

(54) MULTIMODE OUTPUT STAGE CONVERTING DIFFERENTIAL TO SINGLE-ENDED SIGNALS USING CURRENT-MODE INPUT SIGNALS

(75) Inventors: Paul Hildebrant, Banks, OR (US); Jian Li, Portland, OR (US); Hans W. Klein, San Jose, CA (US)

(73) Assignee: Lattice Semiconductor Corp., Hillsboro, OR (US)

(*) Notice: Subject to any disclaimer, the term of this patent is extended or adjusted under 35 U.S.C. 154(b) by 54 days.

(21) Appl. No.: 10/159,681

(22) Filed: May 31, 2002

Related U.S. Application Data

(60) Provisional application No. 60/295,072, filed on Jun. 1, 2001.

(51) Int. Cl.[7] .................................................. H03G 3/10
(52) U.S. Cl. ....................... 330/284; 330/282; 330/278; 330/311
(58) Field of Search .......................... 330/51, 278, 284, 330/282, 311

(56) References Cited

U.S. PATENT DOCUMENTS

| | | | | |
|---|---|---|---|---|
| 3,530,395 A | * | 9/1970 | Prusha | |
| 4,250,556 A | | 2/1981 | Goser | 364/600 |
| 4,855,685 A | * | 8/1989 | Hochschild | |
| 5,068,823 A | | 11/1991 | Robinson | 395/500 |
| 5,107,146 A | | 4/1992 | El-Ayat | 307/465 |
| 5,196,740 A | | 3/1993 | Austin | 307/303 |

(List continued on next page.)

FOREIGN PATENT DOCUMENTS

| EP | 0322382 B1 | 9/1994 |
|---|---|---|
| EP | 0871223 A1 | 10/1998 |
| EP | 0611165 B1 | 7/1999 |

OTHER PUBLICATIONS

Edward K. F. Lee and P. G. Gulak, "Prototype Design of a Field Programmable Analog Array," Aug. 30, 1990, pp. 2.2.1–2.2.8.

Edward K. F. Lee and P. Glenn Gulak, "A CMOS FieldProgrammable Analog Array," *Lee Journal Of Solid–State Circuits*, vol. 26, No. 12, Dec. 1991, pp. 1860–1867.

Lattice Semiconductor Corporation, "isPAC®10 Gain Stages And Attenuation Methods," Sep. 1999, pp. 1–5.

*Primary Examiner*—Michael B Shingleton

(57) ABSTRACT

An output block for an in-system programmable analog integrated circuit. The output block features an output amplifier that accepts a differential current-mode input signal and provides a single-ended output voltage. The output amplifier is also selectably operable as a linear amplifier, an integrator or a comparator. The output block also includes a common-mode feedback circuit (CMFB), an analog trim circuit (OATRM), a CLAMP circuit, and an offset calibration circuit (CLDAC), all coupled to the differential input of the output amplifier. The CMFB exhibits bandwidth comparable to that of the output amplifier and a drive capability that enables the differential-input to single-ended output conversion. The CLAMP is connected to the differential input in the comparator mode in order to avoid slow recovery from an overdrive condition. The OATRM forces a difference current into the differential input that compensates for a (gain independent) offset voltage that results from various mismatches. The CLDAC uses a digital-to-analog converter (DAC) to perform offset calibration at the differential input of the output amplifier. In addition, the output block is configured to be operational in a number of user-selectable modes, including, in one embodiment, one or more of: a linear (NORM) mode, a comparator (COMP) mode, and an integrator (INT) mode. An amplifier in the output block is variously reconfigured to achieve the selected mode of operation. Also, the output block accommodates an auto-calibration (CAL) technique by clamping the single-ended output stage and balancing, through operation of the CLDAC, signals at an input node and at an interstage node of the amplifier.

58 Claims, 10 Drawing Sheets

U.S. PATENT DOCUMENTS

| | | | | |
|---|---|---|---|---|
| 5,285,169 A | * | 2/1994 | Theus | |
| 5,311,142 A | | 5/1994 | Terane et al. | 330/10 |
| 5,363,055 A | * | 11/1994 | Ribner | |
| 5,416,484 A | | 5/1995 | Lofstrom | 341/159 |
| 5,463,349 A | | 10/1995 | Petersen et al. | 330/254 |
| 5,510,738 A | | 4/1996 | Gorecki et al. | 327/103 |
| 5,528,179 A | | 6/1996 | Siniscalchi et al. | 327/103 |
| 5,554,957 A | | 9/1996 | Klein | 330/251 |
| 5,557,234 A | | 9/1996 | Collins | 327/563 |
| 5,574,678 A | | 11/1996 | Gorecki | 364/807 |
| 5,631,606 A | | 5/1997 | Tran | 330/253 |
| 5,680,070 A | | 10/1997 | Anderson et al. | 327/336 |
| 5,821,776 A | | 10/1998 | McGowan | 326/41 |
| 5,877,536 A | | 3/1999 | Inaba | 256/379 |
| 5,877,612 A | | 3/1999 | Straw | 330/254 |
| 5,912,567 A | | 6/1999 | Drost et al. | 327/89 |
| 5,912,583 A | | 6/1999 | Pierson et al. | 327/553 |
| 5,952,867 A | | 9/1999 | Choi | 327/346 |
| 5,959,871 A | | 9/1999 | Pierzchala et al. | 364/489 |
| 5,966,047 A | | 10/1999 | Anderson et al. | 327/565 |
| 5,994,926 A | | 11/1999 | Siniscalchi et al. | 327/65 |
| 6,014,097 A | | 1/2000 | Brandt | 341/156 |
| 6,043,709 A | | 3/2000 | Shin | 330/253 |
| 6,111,437 A | | 8/2000 | Patel | 327/74 |
| 6,118,266 A | | 9/2000 | Manohar et al. | 323/316 |
| 6,140,867 A | | 10/2000 | de Micheli et al. | 327/553 |
| 6,201,429 B1 | | 3/2001 | Rosenthal | 327/333 |

* cited by examiner

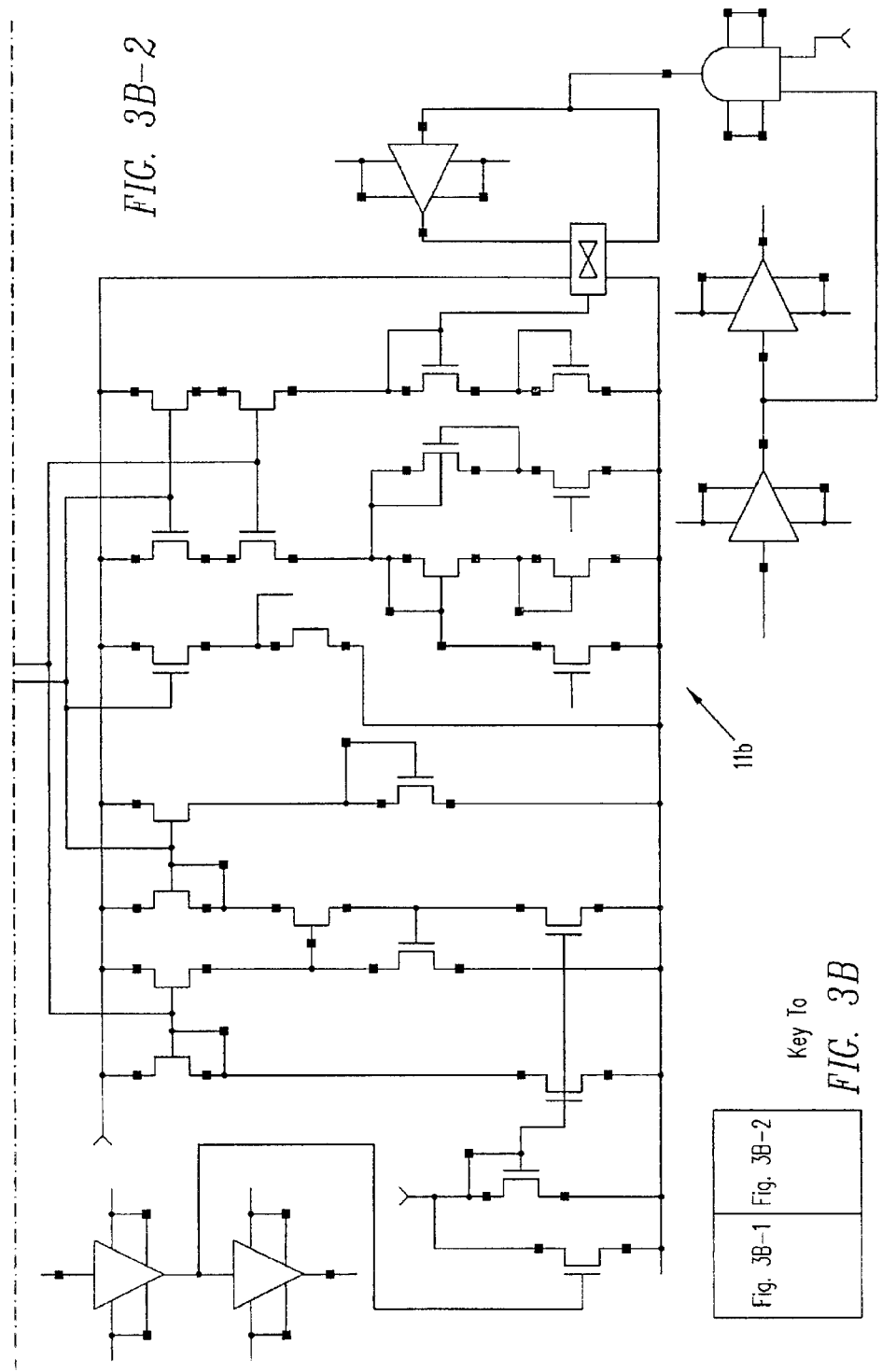

MULTIMODE OUTPUT STAGE CONVERTING DIFFERENTIAL TO SINGLE-ENDED SIGNALS USING CURRENT-MODE INPUT SIGNALS

This application claims the benefit of U.S. Provisional Application 60/295,072, filed Jun. 1, 2001, entitled "Multimode Output Stage Converting Differential To Single-Ended Signals Using Current-Mode Input Signals," and naming Paul Hildebrandt, Jian Li, and Hans W. Klein as inventors. The above-referenced provisional application is hereby incorporated by reference herein in its entirety.

BACKGROUND

1. Technical Field

The invention relates to analog integrated circuit design and, more particularly, to an output stage for an in-system programmable analog device, wherein the output stage provides a differential-to-single-ended conversion and is amenable to a number of selectable modes of operation.

2. Description of the Related Art

Typically, analog integrated circuits are designed to receive one or more analog input signals, and to process those signals by performing specific functions such as amplification, attenuation, filtering, integration, addition and subtraction. These functions usually dictate the topology of the analog integrated circuit. For example, the topologic arrangement of operational amplifiers and resistors are adjusted to provide either inverting or noninverting gain. Every topology has specific noise, distortion and offset voltage sensitivities. Alteration in the function required of an analog circuit often requires a change in the topology of the circuit, with attendant respect to the noise, distortion and offset voltage characteristics of the circuit.

An analog integrated circuit with a programmable analog circuit block architecture permits change in a function of the analog circuit without modification to the topology of the circuit elements, thereby mitigating changes in voltage offset and distortion created by changes in topology. Examples of such analog integrated circuit architectures can be found in U.S. Pat. No. 5,574,678, Continuous Time Programmable Analog Block Architecture, to James L. Gorecki, (the "Gorecki patent"), which is incorporated herein by reference in its entirety for all purposes.

Programmable analog integrated circuits, such as those disclosed in the Gorecki patent, typically include analog circuit blocks interconnected by a programmable interconnect structure and provide a self-contained integrated circuit architecture that supports fundamental analog signal processing functions. The analog circuit blocks include basic circuit elements, such as operational amplifiers, resistors, and capacitors, which can be programmably connected in a variety of circuit configurations. Users can define the functionality of individual blocks, control their respective characteristics, and interconnect blocks to define an overall architecture. Integrating the elements together in a single integrated circuit has a number of advantages. Critical circuit specifications such as dynamic range and common mode rejection can be more easily controlled, helping to make circuit performance more predictable and reliable. The input and output characteristics of the programmable analog circuit block allow the block to be used, within an analog routing pool, with other programmable analog circuit blocks to provide more sophisticate analog circuits without significant degradation in performance. The elimination of external passive components and the addition of programmable interconnect structures for the circuit blocks also reduce the sensitivity of circuit designs to board-level variables and tolerances. Moreover, by removing sensitivity to an analog routing pool and facilitating internal modification of function without changing topologic sensitivity to offset and distortion, an integrated circuit can advantageously be provided with multiple programmable analog circuit blocks and an analog routing pool which can accommodate more complex analog functions.

In one realization, certain programmable analog integrated circuits, such as the ispPAC10™ in-system programmable analog integrated circuit from Lattice Semiconductor Corporation, are advantageous in that they are fully differential from input to output. This improves dynamic range as compared to single-ended input/output (I/O), and affords desirable performance with regard to specified performance characteristics such as power-supply rejection (PSR) and total harmonic distortion (THD). However, to fully exploit the usefulness of the fully differential nature of these programmable analog integrated circuits, and in general any fully differential circuit, other fully differential circuits are needed. For example, many analog circuits utilize a comparator, i.e., a circuit that compares two input voltages, and produces a digital output that is either high or low depending upon the relationship of the two input voltages. Conventional comparators use single-ended inputs for the two input voltages and produce a single-ended output.

Accordingly, a fully differential comparator, where both inputs are differential inputs, for use with fully differential analog circuits, including programmable analog integrated circuits and/or analog circuits comprising discrete components is disclosed in U.S. patent application Ser. No. 09/668,896, Double Differential Comparator and Programmable Analog Block Architecture Using Same, to James L. Goreck and William G. Gazely, assigned to the assignee of this patent application, and hereby incorporated in its entirety for all purposes. That patent application also discloses a digital to analog converter (DAC) circuit with a differential output so as to provide a suitable differential reference voltage for the fully differential comparator, and incorporates fully differential analog circuit components that can be integrated into programmable analog integrated circuits as described above, thereby contributing to the numerous benefits of programmable analog integrated circuits.

Nevertheless, with due recognition to the numerous advantages afforded by devices such as the ispPAC10™ analog integrated circuit, as well as to the fully differential operation enabled by the above-identified patent application, there remain situations in which a differential input, single-ended output architecture represents a more nearly optimal configuration, given, inter alia, compatibility, interoperability and performance considerations. In particular, an analog device that accommodates a differential, current-mode input and that provides a single-ended, voltage-mode output would be especially appreciated. In addition, it is desirable, if not necessary, to provide a technique for performing calibration of a differential-input, single-ended output amplifier, inasmuch as techniques applicable to fully differential configuration appear unavailing. Furthermore, a device that offers additional programmable features by which a user might control and select between modes of operation would add value, as will as flexibility, to circuits and systems into which the programmable analog device is incorporated. For example, a gain stage that is capable of operation, under program control, as a linear amplifier, a comparator, and an integrator would satisfy an as yet unmet need.

SUMMARY

The above and other objects, advantages and capabilities are achieved in one aspect of the invention by a programmable gain stage that includes an amplifier having a differential, current-mode input and a single-ended voltage-mode output, a first programmable feedback network coupled between the amplifier input and a reference potential (GND), a second programmable feedback network coupled between the amplifier input and the amplifier output, a mode control input for receiving a mode control signal that determines the mode of operation of the gain stage, and a mode switch coupled to the amplifier input, to the first feedback network, and to the second feedback network.

As a method of selecting the mode of operation of a programmable gain-stage that includes an amplifier having a differential input and a single-ended output, a feedback network that includes a feedback resistance and a programmable capacitance, a mode-control input, a mode control switch coupled to the mode control input, the amplifier input, and the feedback network, and a CAPCNTRL input, the invention, in a second aspect, comprises: applying a mode-control signal to the mode-control input, distributing a signal derived from the mode-control signal to the mode-control switch, and applying a CAPCNTRL signal to the CAPCNTRL input, the CAPCNTRL signal corresponding to the mode of operation of the gain-stage.

In a further aspect, the invention resides in a programmable gain-stage that operates in response to a mode-control signal. The gain-stage comprises an amplifier, e.g. an operational amplifier, having an inverting input, a noninverting input, and an output. In a particular embodiment, the amplifier is configured to accept a differential, current-mode signal and provide a single-ended voltage output. The gain-stage is selectably operable in a number of alternative modes, in response to a mode control signal that is applied to a mode control switch at the amplifier input. A first feedback network is coupled to the amplifier output, the amplifier inverting input, and the mode control switch. A second feedback network is coupled to a reference node (e.g., GND), the amplifier inverting input, and the mode control switch. The mode of operation, in one embodiment, is determined by switching components in the feedback networks.

In another aspect, the invention may be realized as a multimode amplifier stage for an analog signal processing circuit. The amplifier stage comprises a first (input) stage having a summing node that receives a differential, current-mode signal from, for example, an instrumentation transconductance amplifier. The input stage drives a second (output stage) that provides a single-ended voltage at an output node. The multimode amplifier stage includes a programmable feedback network coupled between the output node and the summing node, and components in the feedback network are switched in/out depending on the mode of operation of the amplifier stage. A mode-control input receives a mode control signal that determines the mode of operation of the amplifier stage, largely as effected by the mode control switch that is coupled to the mode control input, the summing input, and the programmable feedback network. In a specific implementation, the multimode amplifier is selectably operable in a linear mode, a comparator mode, and an integrator mode.

In yet another ramification of the invention, a method of calibrating a differential- input, single-ended output amplifier commences by causing the output stage of the amplifier to assume a predetermined constant value (e.g., 0V). Both an amplifier input and an interstage node are coupled to differential inputs of a sensing circuit. A calibration signal that is applied to the amplifier input is controlled in response to the output of the sensing circuit.

Accordingly, an auto-calibrated, multistage amplifier represents an aspect of the invention. In this regard, such an amplifier comprises a differential input stage having a summing node for accepting a differential input signal, an output stage coupled to the input stage and providing a single-ended output at an output node, means for causing the output node to assume a predetermined value, an interstage node, an autocalibration circuit coupled to the summing node for providing a controllable calibration signal to the summing node in order to calibrate the amplifier, and a sensing circuit having a first input coupled to the summing node, a second input coupled to the interstage node and an output coupled to the autocalibration circuit, wherein the sensing circuit is operable to control the calibration signal that is applied by the autocalibration circuit to the summing node.

The foregoing is a summary and this contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and it's numerous objects, features and advantages made apparent to those skilled in the art by referencing the accompanying Drawings, in which:

FIG. 2 depicts elemental components that contribute to the programmability and multimode operation of the gain-stage;

The use of the same reference number throughout the Figures designates a like or similar element.

Figure 1:
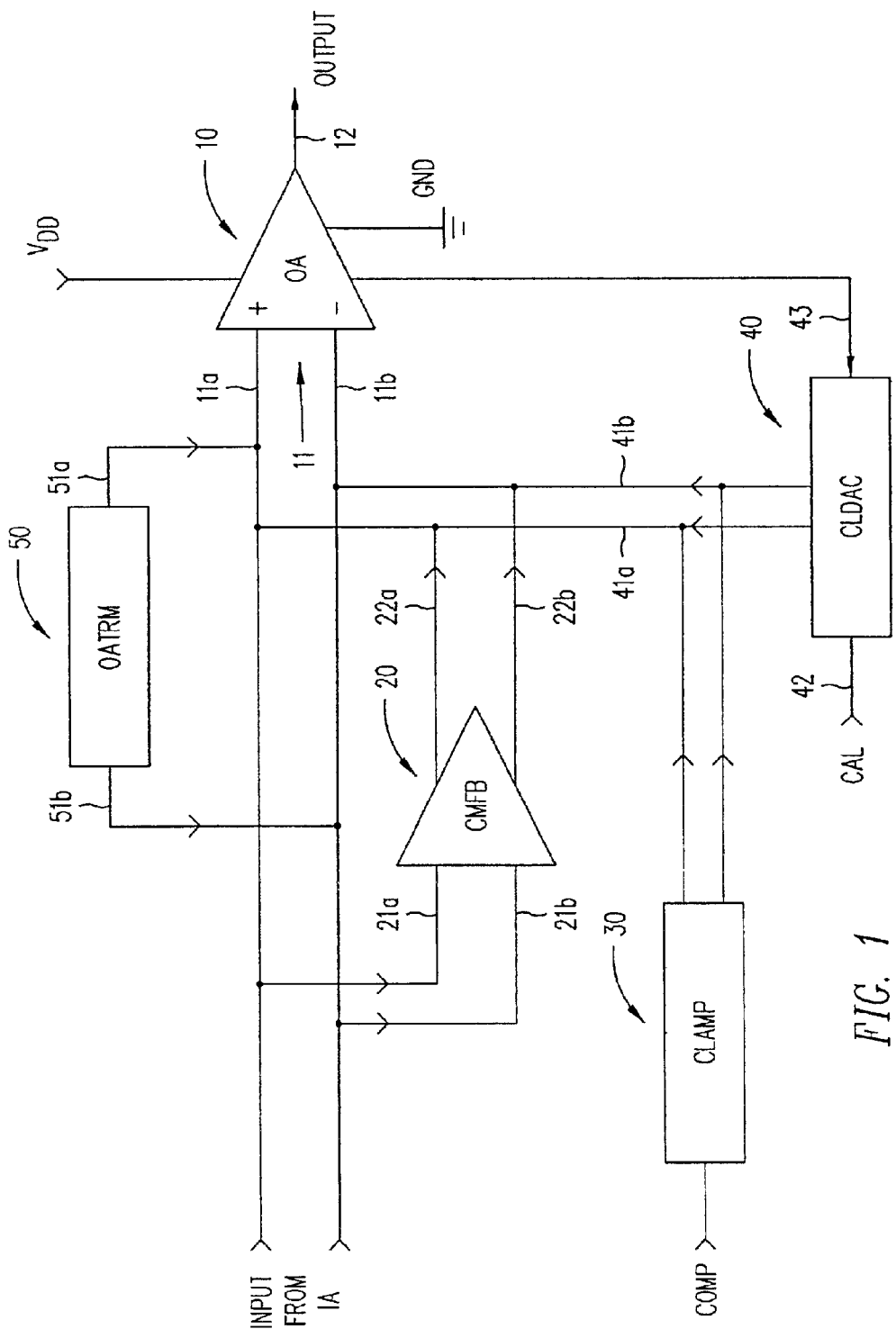
FIG. 1 is a block diagram depicting the significant components of an output gain-stage for an analog signal processing integrated circuit.

While the invention is susceptible to various modifications and alternative forms, specific embodiments thereof are shown by way of example in the Drawings and will herein be described in detail, it should be understood, however, that the Drawings and Detailed Description are not intended to limit the invention to the particular form disclosed. On the contrary, the intention is to cover all modifications, equivalents, and alternatives falling within the spirit and scope of the present invention as defined by the appended Claims.

DETAILED DESCRIPTION

For a thorough understanding of the subject invention, reference may be had to the following Detailed Description, including the appended Claims, in connection with the above-described Drawings.

As suggested above, the invention, in one form, may be instantiated as an output block, or gain-stage, for an in-system programmable analog integrated circuit device, such as the devices that constitute the ispPAC10™, et seq. family of devices commercially available from Lattice Semiconductor Corporation, San Jose, Calif. As a particular aspect of the invention, the gain-stage is selectively operable in a linear mode, an integrator mode, or a comparator mode. In addition, the gain-stage is capable of autocalibration, which requires certain modifications to the manner in which an operational amplifier (op-amp) in the output stage is configured.

The output block features an output amplifier that accepts a differential current-mode input signal and provides a single-ended output voltage. The output amplifier is also selectably operable as a linear amplifier, or in either an integrator or in a comparator mode. The output block also includes a common-mode feedback circuit (CMFB), an analog trim circuit (OATRM), a CLAMP circuit, and an offset calibration circuit (CLDAC), all coupled to the differential input of the output amplifier. The CMFB exhibits bandwidth comparable to that of the output amplifier and has a drive capability that enables the differential-input to be converted to a single-ended output. The CLAMP is connected to the differential input in the comparator mode in order to avoid potentially slow recovery from an overdrive condition. The OATRM forces a difference current into the differential input that compensates for an offset voltage that results from various circuit mismatches. The CLDAC uses a digital-to-analog converter (DAC) to perform offset calibration at the differential input of the output amplifier.

The focal point of the gain-stage in the output amplifier that accommodates a differential, current-mode input and provides a single-ended, voltage-mode output. The amplifier exhibits an inverting, (−), input and a noninverting, (+), input that, collectively, form a summing node at which are applied input, feedback, calibration, trimming and control signals. Programmable feedback networks are coupled between the summing node and, respectively, the amplifier output and a reference potential, such as a circuit ground (GND). A mode-control signal operates, through a mode control switch and attendant logic circuitry, to determine the mode of operation of the gain-stage so that the gain-stage may function, under programmable control, as a linear amplifier, an integrator, or a comparator.

The output stage incorporates an array of desirable features, including programmable feedback in the form of an on/off feedback resistor, a programmable capacitor array in parallel to achieve low-pass behavior, a power-down capability to limit current consumption, offset auto-calibration, and selectable modes of operation, including a integrator mode and a comparator mode. While in comparator mode, not only is the feedback through resistor and capacitor array disabled, thereby achieving open-loop gain, but Miller capacitors inside are disconnected to increase the speed. In the comparator mode no feedback exists, and a DAC and/or input amplifier (IA), with which the output stage operates, delivers a current-mode signal, the voltage at the summing node is substantially undetermined (input signals can easily overdrive the differential input of the OA). To avoid slow recovery from overdrive situation, a clamp circuit is connected to the input to the amplifier so as to limit the voltage in comparator mode. Integrator operation is realized by disconnecting feedback resistors.

An autocalibration (CAL) signal can be applied to force the output stage into a temporary configuration needed for offset calibration. At this time, the output stage of an op-amp is clamped and the op-amp input stage is sensed by a comparator dedicated for offset calibration. Upon completion of the autocalibration sequence, the CAL control signal returns to normal state and the output stage resumes the configuration determined by the mode control signal.

The output stage also features a programmable low-pass filter having a bandwidth that is programmable within the range of 50 kHz –600 kHz, in seven equal-percentage increments. The highest bandwidth (>1 MHz) is achieved by disabling all capacitors in a capacitor array, although a minimum feedback capacitor is connected to ensure the stability.

With reference now to FIG. 1, a high-level block diagram gain-stage may be seen there to include an output amplifier (OA) 10 having a differential input 11 that consists of a noninverting input 11a and an inverting input 11b. Input 11, hereinafter occasionally referred to as the "summing node," receives, at least in one embodiment, a differential, current-mode signal from an instrumentation amplifier (IA) (not shown). Output amplifier has an output 12 that provides a single ended output voltage to downstream circuitry. Output amplifier 10 operates between a nominal 5.0 V supply, $V_{DD}$, and a reference potential, GND.

In a manner more fully described immediately below, OA10 internally converts the differential, current-mode signal at its input to a single-ended voltage at its output. That is, given a zero differential input, the output voltage of OA10 will be 0 V.

As may be readily seen in FIG. 1, the output stage also includes a common-mode feedback (CMFB) circuit 20, an analog trim (OATRM) circuit 50, a clamp (CLAMP) circuit 30 and an offset calibration (CLDAC) circuit 40. The implementation and operation of each of the above-mentioned components of the output stage is described in greater detail below. In general, the CMFB operates to enable differential-input to single-ended conversion and, therefore, must exhibit a bandwidth roughly equivalent to the bandwidth of OA10. OATRM 50 forces a difference current into summing node 11 (11a and 11b) that compensates for gain-independent offset voltages resulting from various circuit mismatches. CLDAC incorporates an D/A converter to perform offset calibration at the differential input of the amplifier. In a manner described below, CLAMP 30 is enabled in the comparator mode so as to circumvent slow recovery from an overdrive condition that occurs in an open-loop configuration.

Figure 2:
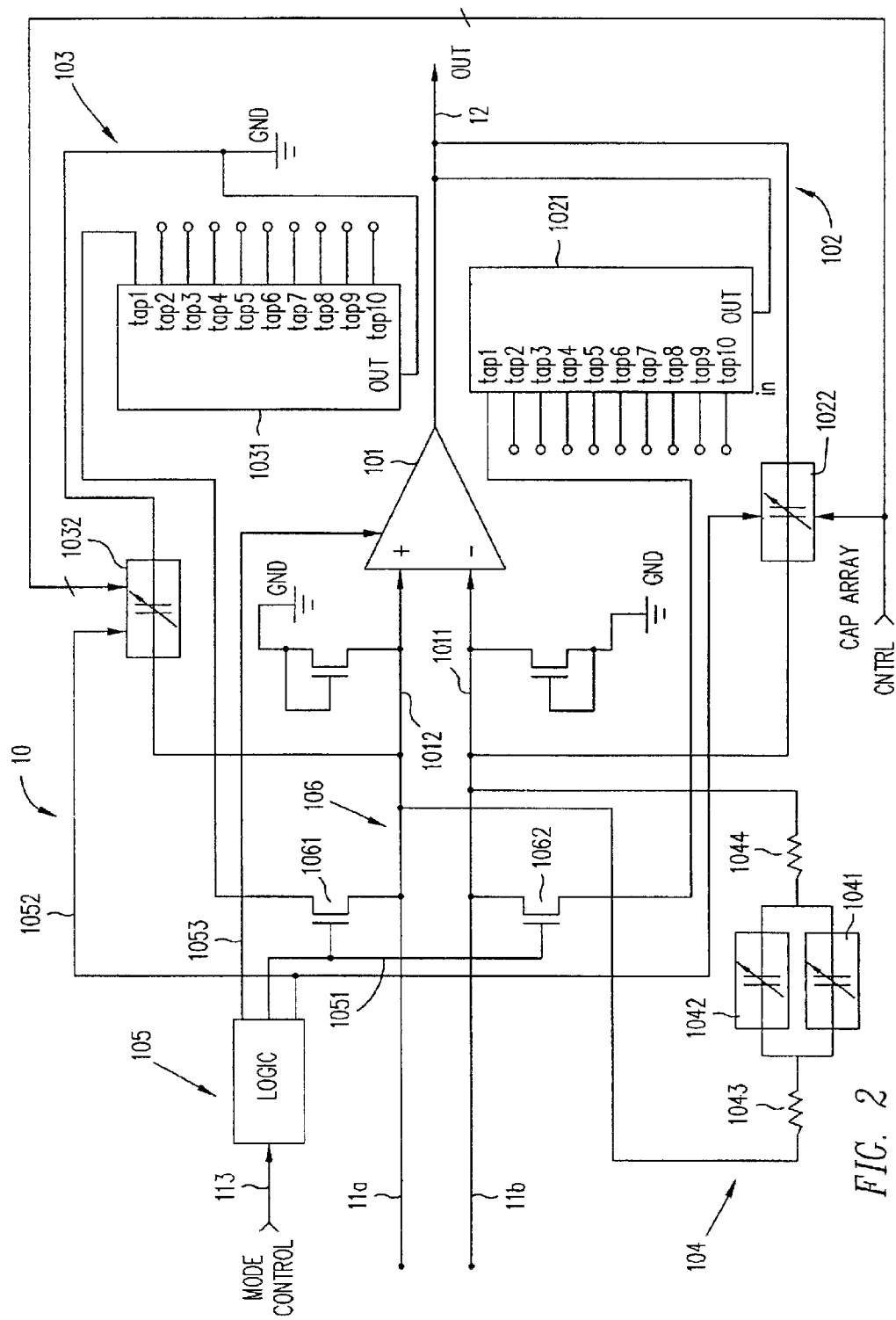
FIG. 2 is a circuit diagram of an output amplifier, together with ancillary control, logic and switching circuitry, that, in one embodiment, is incorporated into the gain-stage of FIG. 1. In particular.

Referring now to FIG. 2, a more detailed depiction of OA10, OA10 is there seen to include an operational amplifier 10 having differential inputs 11a (noninverting) and 11b (inverting) that constitute summing node 11. Op-amp 101 provides a single-ended voltage output at output node 12.

A first feedback network 102, comprising a feedback resistor tap 1021 and a programmable feedback capacitor array 1022, is coupled from output node 12 to the inverting input 1011 (11a) of op-amp 101. A second feedback network 103, comprising a second feedback resistor tap 1031 and a second programmable feedback capacitor array 1032, is coupled between the noninverting input 1012 (11a) of op-amp 101 and GND. To be precise, resistor tap 1021 is coupled to input 1011 through one MOS transistor 1062 in a mode control switch 106, and resistor tap 1031 is coupled to noninverting input 1012 through a second MOS transistor 1061 in switch 106.

An RC compensation network 104 is coupled between inputs 1011 (11b) and 1012 (11b). RC compensation network 104 include dual, parallel capacitor arrays 1041 and 1042, and series tap resistors 1043 and 1044.

RC compensation network 104 is utilized to ensure the loop stability. Through math derivation, one can find that the ratio of the pole over zero of the feedback network is proportional to Cf/(Cf+Ci), where Cf is the feedback capacitance and Ci is the input capacitance associated with summing node 11. By tracking Ci with Cf, one can ensure the loop gain remains relatively constant (as determined by the open-loop gain of op-amp 101), while Cf is changed dramatically. Intuitively, at high frequency the feedback network approaches a capacitor divider, and a large value for Cf means significant feedback. By increasing Ci accordingly, one reduces the feedback at high frequency. The actual feedback network is, of course, much more complicated than a construct that simply recognizes Ri, Ci, Rf, and Cf. The values of the resistors and capacitors in this compensation network may, in one embodiment, be determined through simulation. As indicated above, the corner frequencies of RC filter 104 are programmable in seven, equal-percentage steps. Specifics regarding the programming of filter 104 are set out in Table 1, infra.

Feedback capacitor arrays 1022 and 1032 comprise eight groups of capacitors. One capacitor is always on in the normal mode (filter mode) to ensure the stability of the loop. A user has the ability to change the corner frequency of the filter by turning on/off the other seven groups of capacitors. Each group of capacitors consists of five capacitors, of which four are trim capacitors and one is primary capacitor. By turning on/off the trim capacitors during test, RC product variation of up to 30% can be trimmed with a resolution of 2.2%.

A significant design consideration involves the determination of the minimum size of a MOS switch to be used to control a capacitor group. A simple derivation shows that the on-resistance of the switch should be much less than that of the associated feedback resistor, 1021 or 1031. For this purpose, the magnitude of the capacitance of the capacitance group is largely irrelevant. On the other hand, the on-resistance ($R_{n,on}$) of the switch that controls a trim capacitor should satisfy the relationship: Rtn,on*$C_m$<< (Cm+Ctn)* $R_f$(n=1,2,3,4). Where $C_m$ is the primary capacitor in the group and $C_{tn}$, is one of the trim capacitors.

It is apparent an nMOS transistor in series with Rf will undermine the matching between Rf and effective Rin presented by the IA, and therefore increase gain error. A large nMOS switch is used to reduce the impact of its Ron variation, and the Rf value is adjusted to compensate the Ron at a typical process corner frequency. To avoid possible power supply noise injection through the nMOS switch, a clean (noise-free) control voltage is utilized to control the switch. The simulated gain error caused by this switch, derived of process and temperature variation, varies from −0.09% to +0.19%.

Figure 3A:
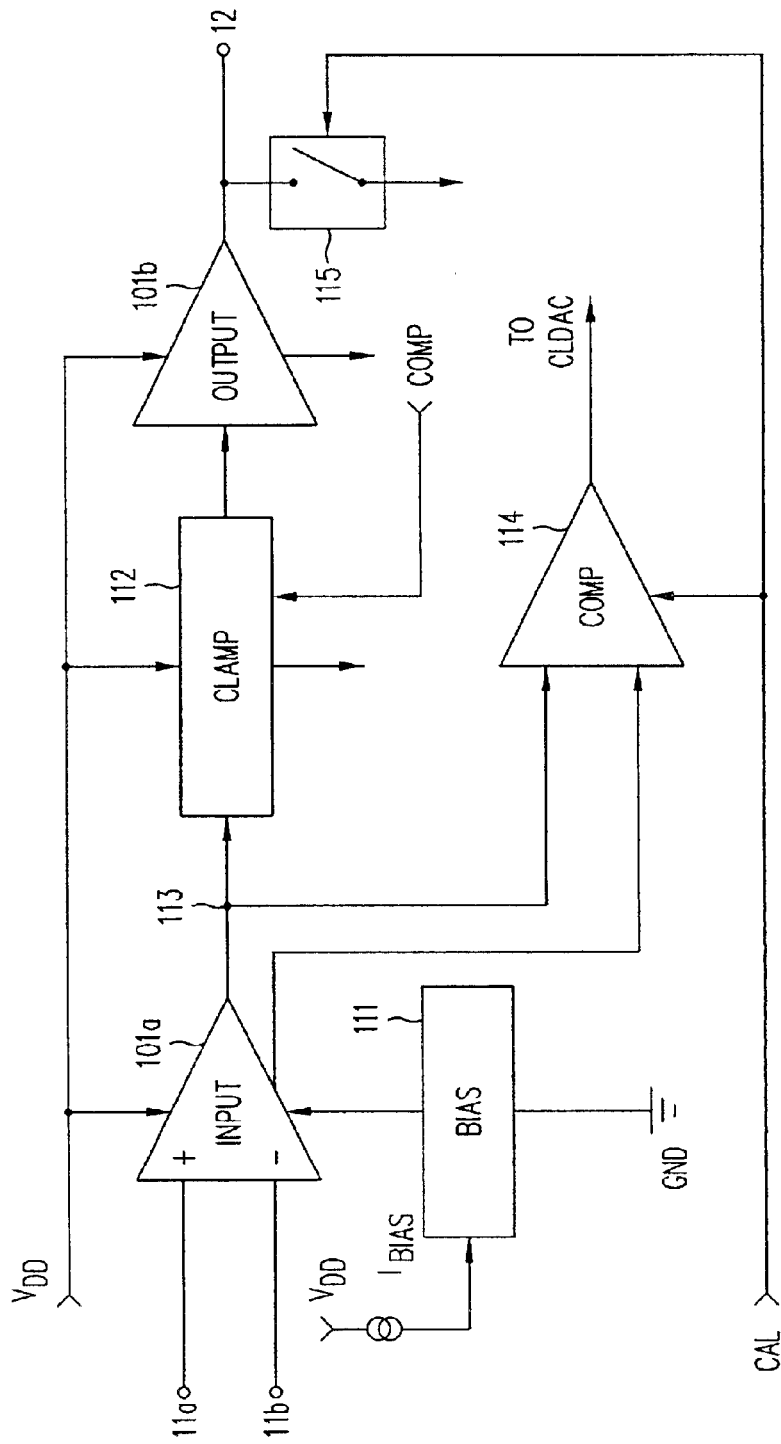
FIG. 3 is a block diagram of an operational amplifier (op-amp) that forms the foundation of the output amplifier depicted in FIG. 2.
FIG. 3B is a device-level circuit diagram of the op-amp of FIG. 3B.

A more granular representation of op-amp 101, including collateral circuit components is provided in FIG. 3A.

Op-amp 101 is seen in FIG. 3A to include a current-mode differential input stage 101a coupled to a single-ended, voltage mode output stage 101b. Specifically, op-amp 101 can be seen to assume the configuration of a two-stage amplifier with a folded cascode input stage and a class AB output stage, with nested Miller compensation (discussed below). The op-amp configuration represents a judicious response to the desire to enable a single-ended output voltage excursions from $V_{DD}$ to GND. A class AB output stage provides the requisite performance, although some gain is sacrificed as the output voltage approaches the extremities $V_{DD}$ and GND. Accordingly, the larger proportion of gain is made available by input stage 101a. In addition, and for reasons that will be disclosed below, the autocalibration feature of the gain-stage is enhanced by the availability of substantial gain from input stage 101a.

With continued reference to FIG. 3A, op-amp 101 is seen to include a bias circuit 111 that supplies various useful bias currents and/or reference voltages to input stage 101a and to output stage 101b. In general, the bias currents and/or reference voltages are synthesized in bias circuit 111 from an input bias current $I_{BIAS}$ that is driven from $V_{DD}$.

An interstage clamp 112 is coupled to an interstage node 113, between $V_{DD}$ and GND. Interstage clamp 112 comprises an arrangement of MOS transistors that are rendered conductive in response to a mode control signal, COMP, that indicates operation in the comparator mode. Because op-amp 101 operates as a comparator (open-loop) in this mode, the clamp attached to interstage node 113 limits the voltage swing at the input of output stage 101b to ensure reasonable switching time in the comparator mode. However, attention must be paid to the control voltages that are applied to the clamp transistors. As a design goal, the non-clamping window must be centered with the operating point of node 112, given process corner and temperature variations.

A significant feature of the operation of op-amp 101 is predicated on the inclusion of comparator 114. Comparator 114 has one input coupled to interstage node 113 and a second input coupled to the summing node 111, that is (in one embodiment), input 11a to input stage 101a. The output of comparator 114 is coupled to CLDAC40 and provides input to the autocalibration D/A converter.

Comparator 114, and associated circuitry, solve a problem that is uniquely applicable to the autocalibration of multistage analog signal processing amplifiers that effect a differential to single-ended conversion. Specifically, a single-ended output necessarily indicates that the output voltage will not traverse a domain around a reference of OV (GND), as is the case with a differential output stage, but will always be positive voltage. Accordingly, the output voltage is not useful as an input to autocalibration circuitry. The solution disclosed here is based on a technique in which output 12 caused to remain constant, or clamped, at GND. Many techniques to accomplish this objective no doubt occur to those of ordinary skill. In the embodiment disclosed here, node 12 is simply forced to GND by a generically represented switch 115 that is activated in response to the mode control signal CAL. CAL signifies the autocalibration mode and is used here to enable comparator 114, as well as to close switch 115. Switch 115 may be implemented in many forms, including, perhaps most likely, MOS switching transistors. In essence, when activated in the CAL mode, comparator 114 senses a differential signal at interstage node 113. Depending on the polarity of that differential signal, the output of comparator 114, ultimately coupled to CLDAC40, causes the D/A of CLDAC40 to count either up or down and thereby vary the differential calibration signal that is forced into summing node 11. (See FIG. 1.) This process is applied for each bit of the D/A in CLDAC40, thereby achieving minimum residual offset of the gain stage.

Figures 1, 3B:
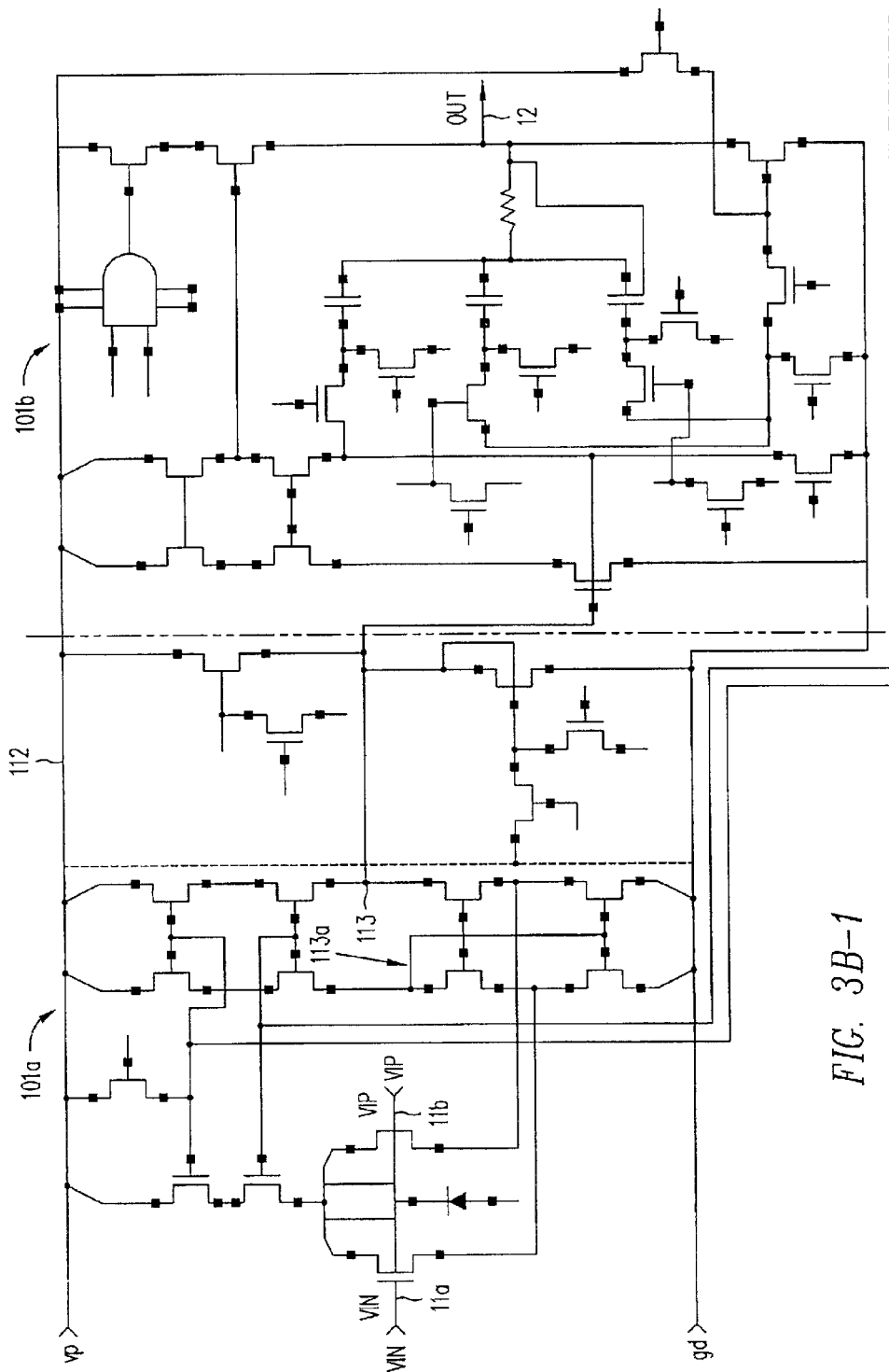

For a more detailed understanding of the design of op-amp 101, attention is directed to FIG. 3B, a schematic diagram that includes detail at the device level. FIG. 3B has been partitioned to indicate devices that respectively constitute input stage 101a, output stage 102b, clamping transistors 112, and bias circuit 116. In addition, significant signal nodes, including input nodes 11a and 11b, output node 12, and interstage node 113 are apparent in FIG. 3B. Input stage 101a is seen to include a pMOS input pair that contribute to the high input stage gain and afford desirable low-noise performance. In one implementation, interoperability with the IA requires that the input stage operate at a common-mode voltage of 0.75 V.

Output stage 101b employs a nested Miller configuration to obtain additional gain from the p-channel path. Skilled analog integrated circuit designers intuitively appreciate that there exist two distinct gain-stages along the p-channel path of the nested Miller structure. In contradistinction, there is only one gain-stage along the n-channel path. This configuration delivers a relatively high stage gain, even though the nMOS output driver transistor provide negligible gain.

A second compensation capacitor, CC2 is shown in FIG. 3B and is associated with the pMOS output driver transistor. CC2 generates a pole/zero pair that substantially cancel. Concurrently, the pole associated with the pMOS output driver gate node is extended to a higher frequency.

Also apparent in FIG. 3B is a arrangement whereby an additional Miller compensation capacitor, CCM2, is included in parallel with the primary Miller compensation capacitor CCM1. CCM2 is, in fact, switched in response to control signals that establish the bandwidth of op-amp 101. In one embodiment, CCM2 is switched in when the corner frequency of the RC input filter 104 (see FIG. 1) is set lower than 250 KHz. In this situation, CCM2 serves to ensure the stability of op-amp 101.

Referring again to FIG. 1, the gain-stage also includes a common-mode feedback circuit (CMFB) 20 having respective inputs 21a and 21b coupled to the differential current inputs from the, for example, IA and respective outputs 22a and 22b coupled to the summing mode, that is; to (+) input 11a and to (−) input 11b. CMFB20 is designed to sink/source sufficient current from/to the summing node to maintain the common-mode input at a level necessary to present the desired interface to the IA and to assure proper operation of OA10. In the absence of CMFB20, the common mode level at OA input 11 would be $V_{out}/2$. Accordingly, it may be seen that CMFB20 is significant in the differential-to-single-ended transformation effected by the gain stage. CMFB20 is designed to process bandwidth adequate to respond to AC variations in the common-mode signal that appears at summing node 11.

As may be seen in FIG. 1, CMFB20 has a pair of inputs 21a and 21b that are coupled to the IA. A third input 21c is coupled to a common-mode reference voltage $V_{Ref}$. The outputs 22a and 22b of CMFB20 are coupled to the summing node 11 of OA10. A detailed circuit diagram of CMFB is provided in FIG. 4.

Figure 4A:
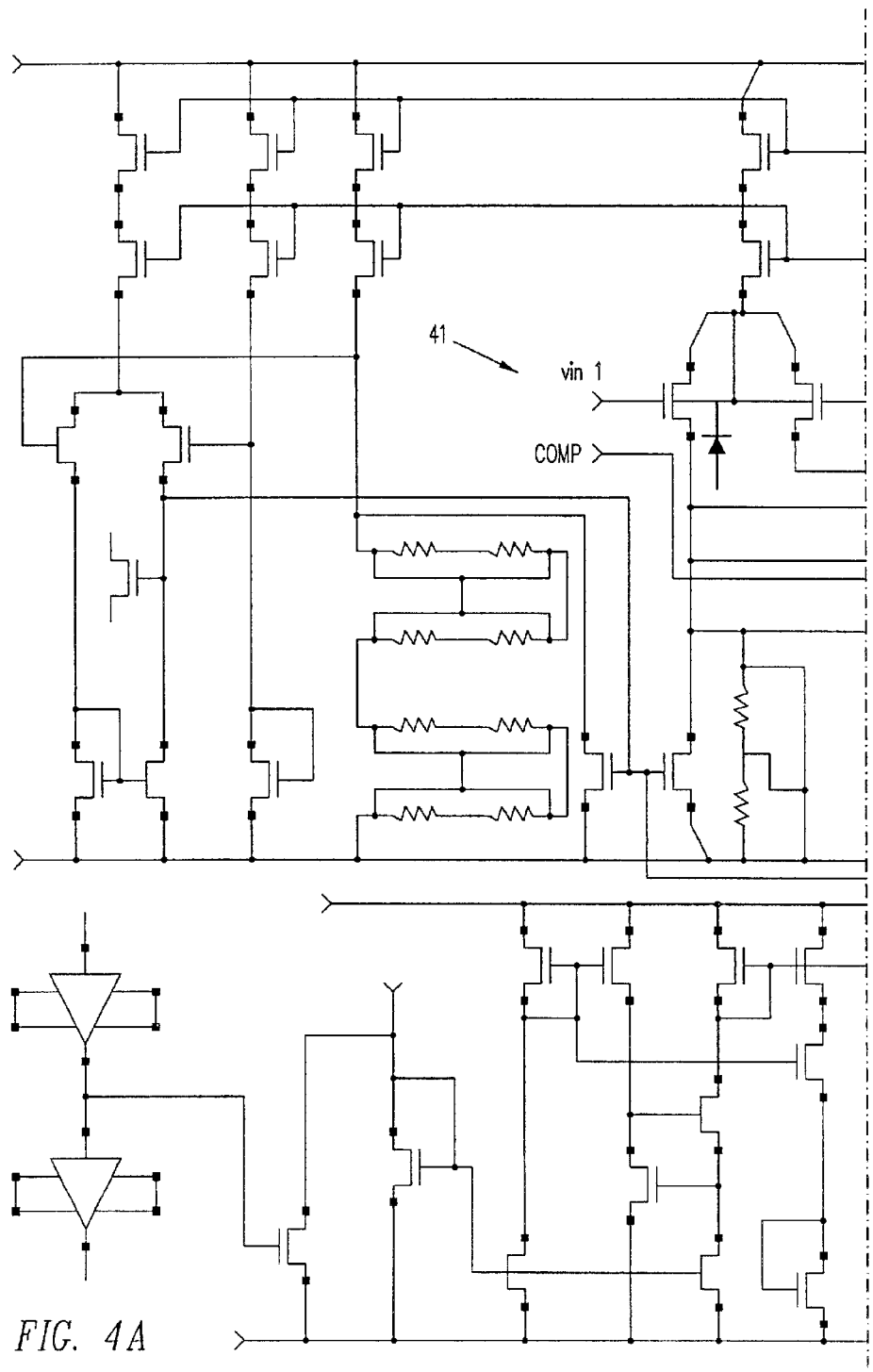
FIG. 4 is a circuit diagram of the common-mode feedback (CMFB) circuit illustrated in FIG. 1.
Figure 4B:
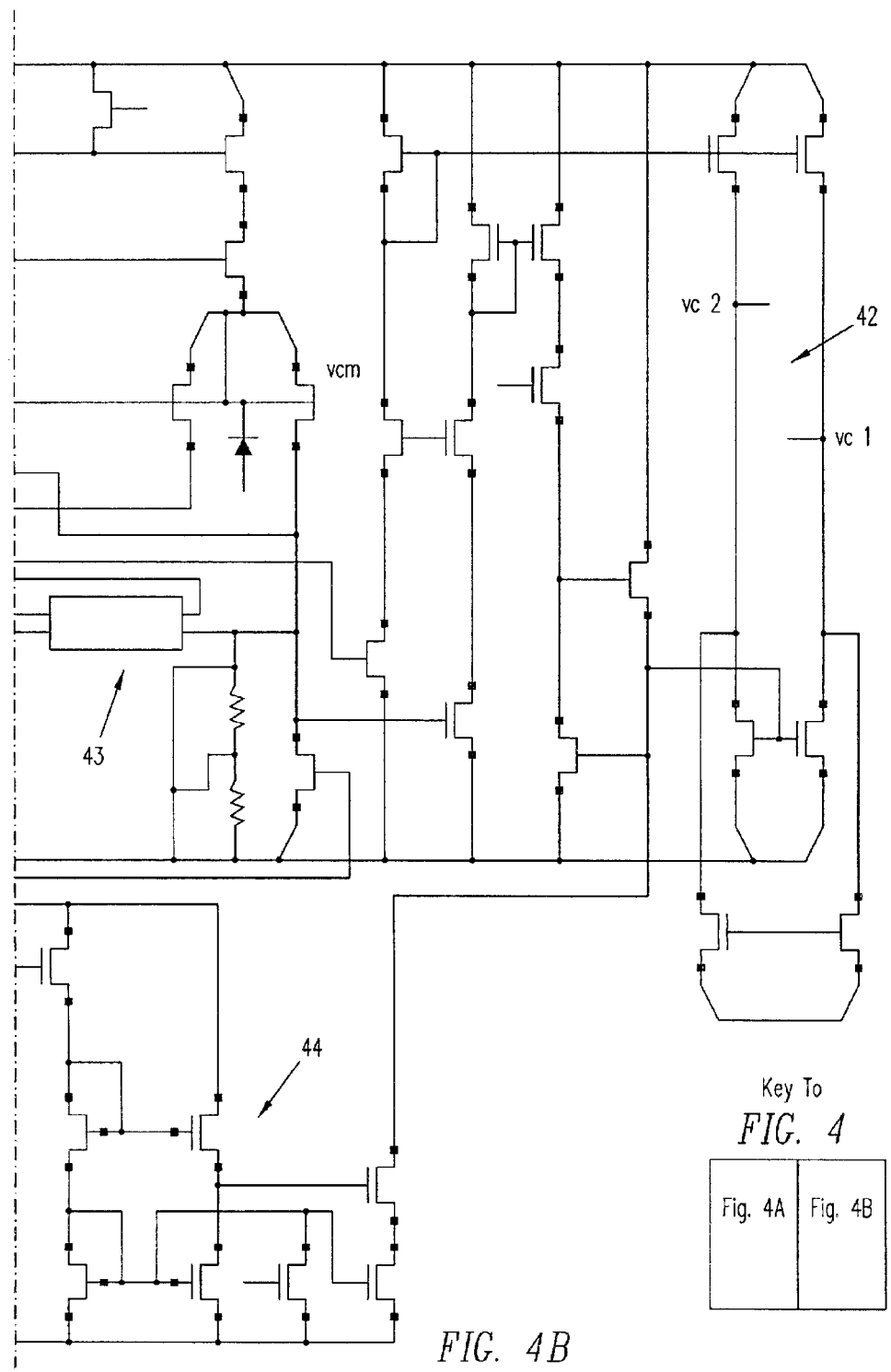

Referring now to FIG. 4, which is a device-level representation of CMFB20, it is seen that a dual input stage is used to sense the common mode voltage at summing node 11. The dual input stage avoids the use of a sensing resistor, and a concomitant pole in the frequency response of CMFB20. Because there exists significant capacitance at summing node 11, and because the output of CMFB20 approximates an ideal current source, the dominant pole in the common mode feedback loop is established by the summing node, rather than by the internal characteristics of CMFB20.

With continued reference to FIG. 4, CMFB20 may be seen to include a two-stage operational amplifier (op-amp) with a dual voltage input stage 41 and a push-pull output stage 42. Limited gain is achieved in the input stage, creating a pole associated with that stage that is not dominant. This condition is achieved in CMFB20 by providing a load on the input stage that consists essentially, for the above-stated purpose, of a resistance in parallel with a small transistor.

Also included in CMFB20 is a bias circuit 44 that establishes the operating point of the output node of the input stage. This technique enables the impedance at the output node 42 to be independently adjustable.

In order to achieve the desired matching from the output pMOS and nMOS transistor pairs, the respective gate areas of those transistors must be large. Consequently, the significant gate capacitances causes the poles associated with the output transistors to be lower than desired. In order to circumvent this effect, a transistor is included with each of the output transistors so as to increase the equivalent conductance looking into the output nodes.

Additionally, in order to ensure the stability of CMFB20, a series RC network 43 is included between the output nodes of the first (input) stage, thereby reducing loop gain at high frequency. In the comparator (COMP) mode, where common mode loop gain is less significant, the RC network 43 is switched to a resistor string, further reducing loop gain and enhancing stability.

Referring again to FIG. 1, the output stage is there seen to include a clamping circuit (CLAMP) 30. CLAMP 30 produces two outputs, 30a and 30b, that connect to the plus and minus summing nodes 11a and 11b. These two outputs are high impedance when the voltage on them is close to 0.75 V, which is the normal summing node common-mode voltage. When the summing node voltage is several tenths of a volt higher or lower than 0.75 v, outputs 30a and 30b draw current and clamp the summing node 11 from being pulled too far from the normal common mode voltage, thereby improving overload recovery time.

Figure 5A:
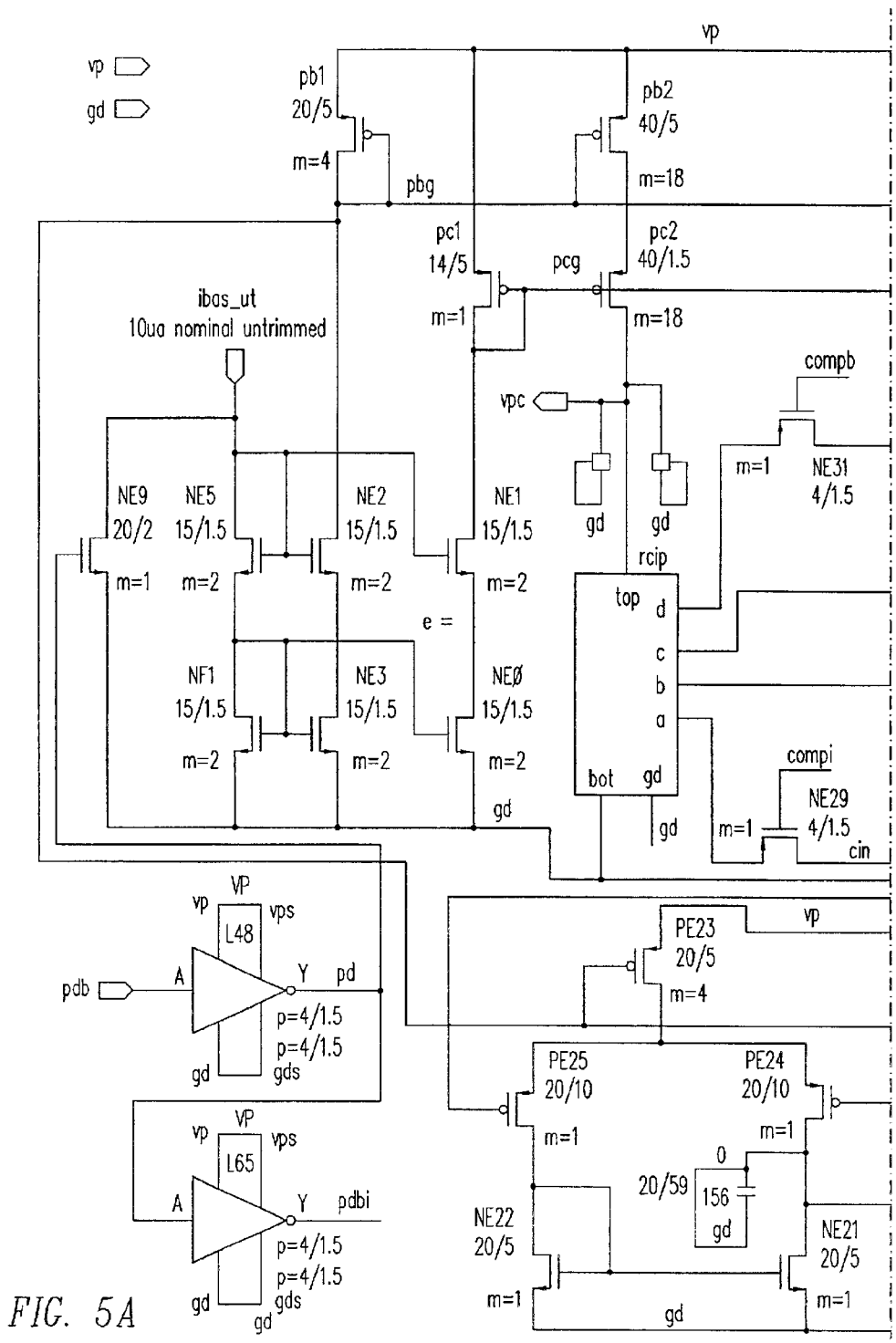
FIG. 5 is a circuit diagram of a voltage clamp (CLAMP) used at the input of the FIG. 1 output amplifier to enhance performance in a comparator mode.
Figure 5B:
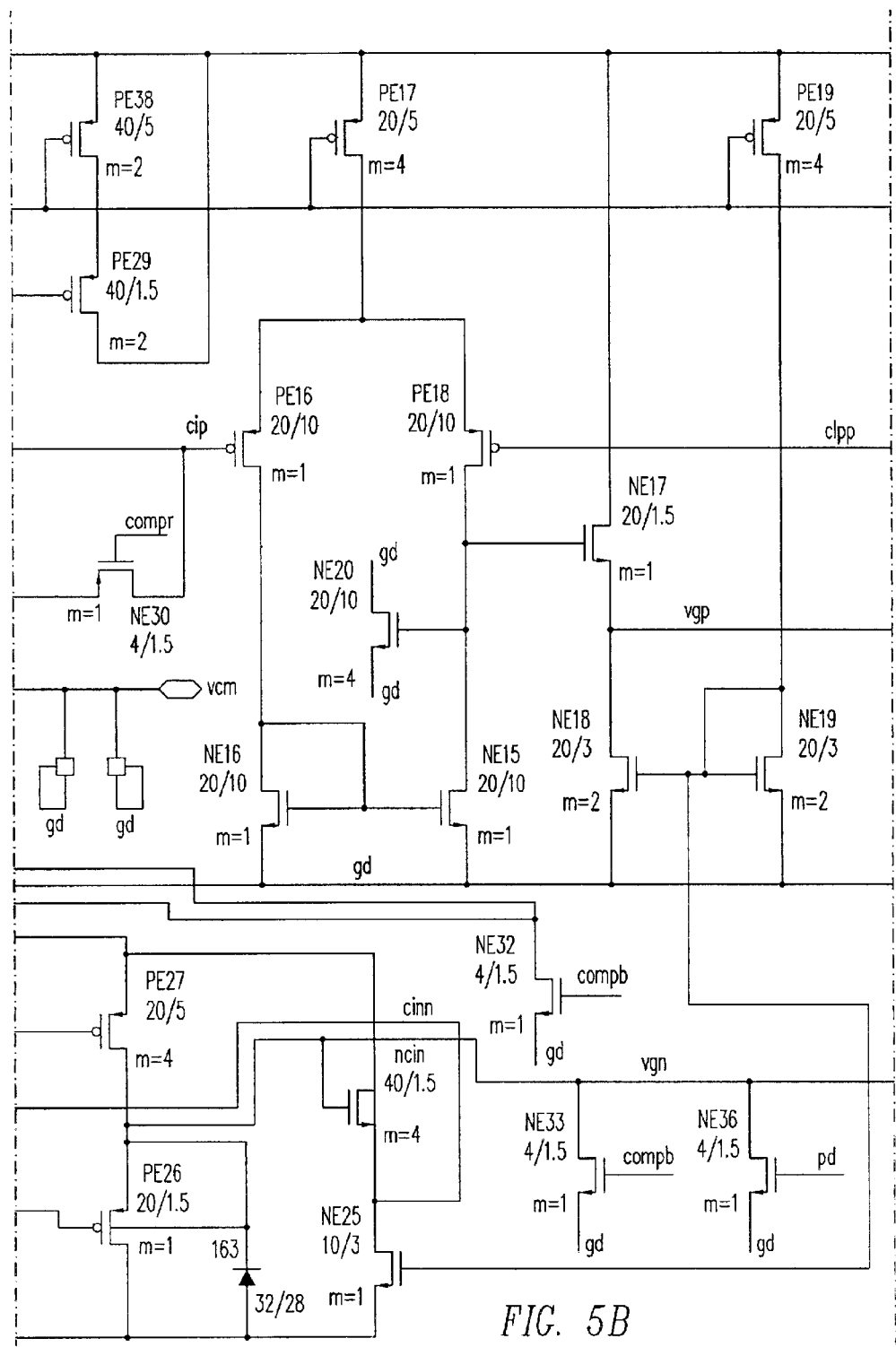
Figure 5C:
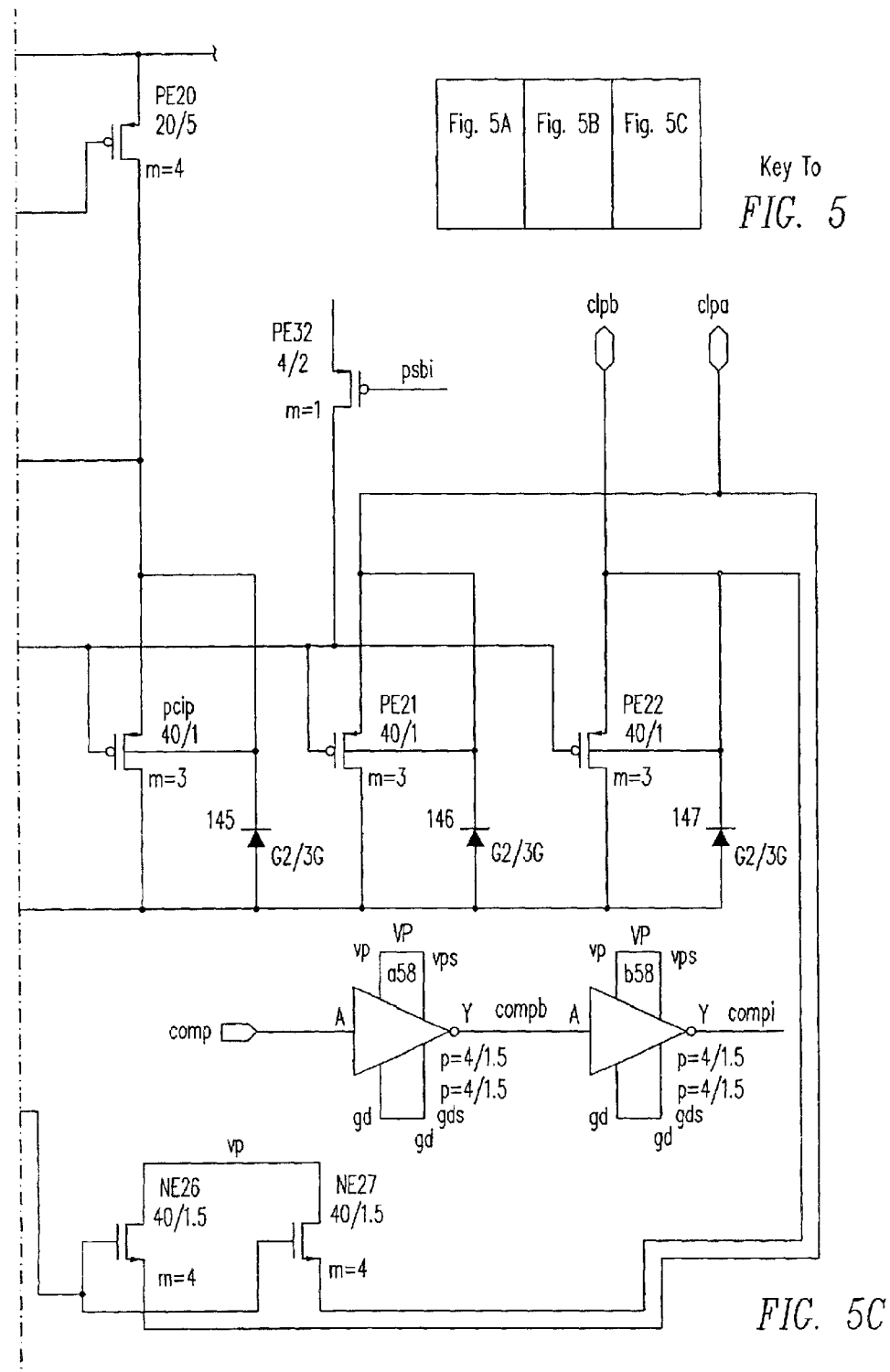

A detailed circuit diagram of CLAMP 30 is provided in FIG. 5, from which specific salient operational aspects of CLAMP 30 may be perceived. In this regard, note that the voltage on signal "clp" is the positive clamping voltage. Transistors PE17, PE16, PE18, NE16, NE15, NE17 and NE18 form a feedback amplifier that causes "clpp" to be at the same voltage as "clp," and "vgp" to be about one VTP below "clpp." This causes PE21/PE22 to clamp at a voltage equal to the voltage on "clp." Similarly, the voltage on signal "cln" is the negative clamping voltage. Transistors PE23, PE25, PE24, NE22, NE21, PE27 and PE28 form a feedback amplifier that causes "clnn" to be at the same voltage as "cln," and "veg" to be about one VTN above "clnn." This causes NE26/NE27 to clamp at a voltage equal to the voltage on "cln." The "clp" and "cln" voltages are generated by passing an untrimmed current through the resistor string in the cell "relp." This cell also produces the voltage "vcm" which is used as the common mode voltage by the common mode bias circuit associated with each OA.

As may be seen again in FIG. 1, the output gain-stage also includes an offset calibration circuit (CLDAC) 40 that has outputs 41a and 41b, respectively, coupled to inputs 11a and 11b of OA10. CLDAC is rendered operational upon application of the CAL mode control signal applied to input 42. CLDAC 40 operates in response to the output of comparator 114 that is internal to op-amp 101. (See. FIG. 3A and Description of the operation of comparator 114, supra.)

CLDAC 40 is used in a manner familiar to those skilled in the art to calibrate OA10. Typically, a calibration mode is initiated automatically by, for example, a circuit POWER ON signal or by a specific calibrate command signal (CAL) that allows calibration to be requested by any time. In a preferred embodiment, simultaneous successive approximation routines (SAR) are used to determine the amount of offset error referred to multiple instances of OA10. That error is then nulled by a respective calibration DAC. The calibration constant can be stored in memory, but is preferably recomputed each time the programmable output stage circuit enters a new configuration. One example of an automatic calibration circuit, such as CLDAC is described in U.S. patent application Ser. No. 09/053,251, entitled Offset Voltage Calibration DAC with Reduced Sensitivity to Mismatch Errors, by James L. Gorecki and Yaohua Yang, which is incorporated herein by reference in its entirety.

As has been intimated above, a significant aspect of the operation of the analog output stage that has been described above derives from its versatility. That is, the output stage can be programmed or controlled to operate in at least three modes of operation: linear (NORM), comparator (COMP) and integrator (INT). The mode of operation is determined by a mode-control signal that is applied to a mode-control input that is illustrated in FIG. 2. The mode-control signal whether the gain-stage is to operate in the NORM, COMP, or INT. (In some embodiments, the autocalibration (CAL) signal may also be considered a component of the mode-control signal. Alternatively, the CAL signal may be perceived as disparate to the mode-control signal. However, the CAL mode is logically included as a fourth mode of operation.)

In order to promote a generalized understanding of the invention and in an effort to avoid obfuscation of the inventive concept with unnecessary detail, the mode-control signal is shown in FIG. 2 to be coupled to a logic circuitry 105. Logic circuitry 105 will be understood by skilled designers to include elements adequate to configure, condition and distribute the mode-control signal, or various derivatives thereof, to functional elements of the gain-stage in order to effect the operation to be presently described.

In the COMP mode, the gain-stage operates in substantially an open-loop manner. Accordingly, an output 1051 of logic 105 is coupled to mode-control switch 106 at respective gates of MOS transistors 1061 and 1062, thereby causing those transistors to become nonconducting. Consequently, resistor taps 1031 and 1021 are disconnected from inputs 11a (noninverting) and 11b (inverting), respectively, of op-amp 101. Concurrently, a CAPCNTRL signal at output 1052 of logic 105 is applied to both capacitor array 1032 and capacitor array 1022, causing the effective capacitances of the arrays to acquire a minimum value. Additionally, output 1053 of logic 105 is coupled to op-amp 101. this signal is used to clamp interstage node 113 (see FIG. 3 and this Description, supra), as well as to disconnect one or both of the Miller capacitances CCMA and CCM2 through associated MOS switches shown in FIG. 3. Disconnecting the Miller capacitances speeds comparator action of the output stage. Finally, as shown in FIG. 1, input CLAMP 30 is activated to limit the voltage excursions at summing node 11, thereby accelerating recovery from any overdrive condition that might be encountered.

Integrator (INT) mode is achieved by, again, disconnecting resistor taps 1032 and 1031. A user determined CAPCNTRL signal is applied to the capacitor arrays in a manner that enables the integrator time constant to be user-selectable.

Various aspects of the programmable features of the output stage have been described above. To fortify an understanding of this aspect of operation, Table 1 specifically characterizes the control signals that are relevant to the operation of the analog gain-stage.

TABLE 1

Programming Table for each OA configuration:

| Control Bits | Name | Definition |
|---|---|---|
| <1> | PDb | Power on/off |
| <2> | INTEG | Integrator mode |
| <3–5> | OACF[2:0] | Capacitive feedback |
| <6> | COMP | Comparator mode, compensation off, etc. |

The assignment for "Power down" is as follows:

| PDB | PDGb | Definition |
|---|---|---|
| 0 | 0 | Cell is powered-down, draws basically no |
| 0 | 1 | Cell is powered-down, draws basically no current |
| 1 | 0 | Cell is powered-down, draws basically no current |
| 1 | 1 | Cell is active |

The bit assignment for Resistive Feedback is as follows:

| INTEGn (n = 1 ... 2) | Definition (n + 1 → INTEG1 controls OA1, and so forth) |
|---|---|
| 0 | Integrator mode off |
| 1 | Integrator mode on |

The bit assignment for Capacitive Feedback is as follows:

| CFn[2:0] (n = 1 ... 2) | Definition (n = 1 → INTEG1 controls OA1, and so forth) |
|---|---|
| 000 | Capacitive feedback off |
| 001 | Smallest cap on |
| ... | ... |
| 110 | ... |
| 111 | All caps on |

The following table specifies the frequencies of RC input filter 104, using the "equal distance" rule:

| CFn[2:0] | Corner frequency |
|---|---|
| 000 | >1 MHz |
| 001 | 600 kHz |
| 010 | 400 kHz |
| 011 | 250 kHz |
| 100 | 170 kHz |
| 101 | 115 kHz |
| 110 | 75 kHz |
| 111 | 50 kHz |

The "equal distance rule" means that the frequency ratio of two subsequent frequencies is constant and, in one embodiment, equal to 1.5.

| The bit assignment for the Comparator Mode is as follows: | |
|---|---|
| COMPn<br>(n = 1 . . . 2) | Definition<br>(n = 1 → COMP1 controls OA1, and so forth) |
| 0 | All Miller and Bandwidth-trim caps are on (amplifier mode) |
| 1 | All Miller and bandwidth-trim caps are off (comparator mode) |

Although the present invention have been described in connection with several embodiments, the invention is not intended to be limited to the specific forms set forth herein, but on the contrary, it is intended to cover such alternatives, modifications, and equivalents as can be reasonably included with in the spirit and scope of the invention as defined by the appended claims.

What is claimed is:

1. A programmable gain stage comprising:
   an amplifier having a differential, current-mode input and a single-ended voltage-mode output;
   a first programmable feedback network coupled between the amplifier input and a reference potential (GND);
   a second programmable feedback network coupled between the amplifier input and the amplifier output; and
   a mode control input for receiving a mode control signal that determines the mode of operation of the gain stage; and
   a mode control switch coupled to the amplifier input, to the first feedback network, and to the second feedback network.

2. A programmable gain stage as defined in claim 1, wherein the first feedback network includes a resistance coupled to the amplifier input through the mode control switch.

3. A programmable gain stage as defined in claim 2, wherein the second feedback network includes a second resistance coupled to the amplifier input through the mode control switch.

4. A programmable gain stage as defined in claim 3, wherein the first resistance and the second resistance are programmable.

5. A programmable gain stage as defined in claim 1, wherein the first feedback network includes a programmable capacitance coupled to the amplifier input.

6. A program gain stage as defined in claim 1, wherein the second feedback network includes a programmable capacitance coupled to the amplifier input.

7. A programmable gain stage as defined in claim 6, wherein the first feedback network includes a programmable capacitance coupled to the amplifier input.

8. A programmable gain stage as defined in claim 1, wherein the mode control switch is operable In response to the mode control signal to cause the gain stage to operate alternatively in a comparator mode or in an integrator mode.

9. A programmable gain stage as defined in claim 8, wherein the mode control switch comprises:
   a first semiconductor device coupled to the mode control input and coupled between the first feedback network and an noninverting input of the amplifier, and
   a second semiconductor device coupled to the mode control input and coupled between the second feedback network and an inverting input of the amplifier.

10. A programmable gain stage as defined in claim 9, wherein the mode control switch Is coupled to the mode control signal through a logic circuit.

11. A programmable gain stage as defined in claim 10, wherein the semiconductor devices are MOS transistors.

12. A programmable gain stage as defined in claim 11, wherein the first feedback network includes a resistance coupled to the amplifier input through the mode control switch.

13. A programmable gain stage as defined in claim 11, wherein the second feedback network includes a second resistance coupled to the amplifier input through the mode control switch.

14. A programmable gain stage as defined in claim 13, wherein the first resistance and the second resistance are programmable.

15. A programmable gain stage as defined in claim 11, wherein the first feedback network includes a programmable capacitance coupled to the amplifier input.

16. A programmable gain stage as defined in claim 11, wherein the second feedback network includes a programmable capacitance coupled to the amplifier input.

17. A programmable gain stage as defined in claim 16, wherein the first feedback network includes a programmable capacitance coupled to the amplifier input.

18. A programmable gain stage as defined in claim 11, wherein the mode control switch is operable in response to the mode control signal to cause the gain stage to operate alternatively in a comparator mode or in an integrator mode.

19. A method of selecting a mode of operation of a programmable gain-stage that includes:
   (i) an amplifier having a differential, current-mode input and a single-ended voltage-mode output;
   (ii) a feedback network that includes a feedback resistance and a programmable capacitance;
   (iii) a mode-control input;
   (iv) a mode-control switch coupled to the mode-control input, the amplifier input, and the feedback network; and
   (v) a CAPCNTRL input, THE METHOD COMPRISING:
   applying a mode control signal to the mode-control input;
   distributing a signal derived from the mode-control signal to the mode-control switch; and
   applying a CAPCNTRL signal to the CAPCNTRL input, the CAPCNTRL signal corresponding to the mode of operation of the gain-stage.

20. A method as defined in claim 19, wherein mode-control signal is a COMP signal that causes the feedback resistance to be disconnected from the amplifier input.

21. A method as defined in claim 20, further comprising:
   applying a CAPCNTRL signal that causes programmable capacitance to assume a minimum value.

22. A method as defined in claim 21, further comprising:
   activating a CLAMP coupled to the input of the amplifier.

23. A method as defined in claim 22, further comprising:
   activating an interstage clamp coupled to an interstage node of the amplifier.

24. A method as defined in claim 23, further comprising:
   disconnecting a Miller capacitance associated with an output stage of the amplifier.

25. A method as defined in claim 19, wherein the mode-control signal in an INT signal that causes the feedback resistance to be disconnected from the amplifier unit.

26. A method as defined in claim 25, further comprising:
   establishing an integrator time constant through a CAPCNTRL signal applied to the CAPCNTRL input.

27. A programmable gain stage operable in response to a mode control signal, the gain stage comprising:
   an amplifier having a current-mode inverting input, a current-mode noninverting input, and a single-ended voltage-mode output;
   a mode control switch having a node responsive to the mode control signal;
   a first feedback network coupled to the amplifier output, the amplifier inverting input, and the mode control switch; and
   a second feedback network coupled to a reference node, the amplifier noninverting input, and the mode control switch.

28. A programmable gain stage as defined in claim 27, wherein the first feedback network comprises a programmable capacitance coupled between the amplifier output and the inverting input and comprises a resistance coupled to the inverting input through the mode control switch.

29. A programmable gain stage as defined in claim 27, wherein the second feedback network comprises a programmable capacitance coupled between GND and the noninverting input and comprises a resistance coupled to the noninverting input through the mode control switch.

30. A programmable gain stage as defined in claim 28, wherein the second feedback network comprises a programmable capacitance coupled between GND and the noninverting input and comprises a resistance coupled to the noninverting input through the mode control switch.

31. A programmable gain stage as defined in claim 27, wherein the mode control switch comprises:
   a first semiconductor device coupled to the mode control signal and coupled between the first feedback network and an inverting input of the amplifier; and
   a second semiconductor device coupled to the mode control signal and coupled between the second feedback network and a noninverting input of the amplifier.

32. A programmable gain stage as defined in claim 27, wherein the mode control switch is coupled to a mode control input through a logic gate.

33. A programmable gain stage as defined in claim 31, wherein the semiconductor devices are MOS transistors.

34. A programmable gain stage as defined in claim 27, wherein the mode control signal is operable to cause the programmable gain stage to operate alternatively in an integrator mode or in a comparator mode.

35. A programmable gain stage as defined in claim 34, wherein the first feedback network comprises a programmable capacitance coupled between the amplifier output and the inverting input and comprises a resistance coupled to the inverting input through the mode control switch.

36. A programmable gain stage as defined in claim 34, wherein the second feedback network comprises a programmable capacitance coupled between GND and the noninverting input and comprises a resistance coupled to the noninverting input through the mode control switch.

37. A programmable gain stage as defined in claim 35, wherein the second feedback network comprises a programmable capacitance coupled between GND and the noninverting input and comprises a resistance coupled to the noninverting input through the mode control switch.

38. A programmable gain stage as defined in claim 34, further comprising:
   means coupled to the mode control signal and to the amplifier inputs for avoiding slow recovery of the programmable gain stage from an overdue condition in the comparator mode.

39. A multimode amplifier stage for an analog integrated circuit, the amplifier stage comprising:
   an input stage having a summing node for a differential, current-mode input signal;
   an output stage having an output node for providing a single-ended voltage;
   an interstage node;
   a reference node;
   a mode control input for coupling to a mode control signal that determines the mode of operation of the amplifier stage;
   a programmable feedback network coupled between the output node and the summing node; and
   a mode control switch coupled to the summing node and to the programmable feedback network.

40. A multimode amplifier stage as defined in claim 39, wherein the mode control switch is operable in response to a mode control signal to cause the gain-stage to operate, alternatively, in a linear mode, a comparator mode, or an integrator mode.

41. A multimode amplifier stage as defined in claim 40, further comprising:
   a CMFB coupled to the summing node for facilitating conversion of a differential-current input to single ended voltage output;
   a CLAMP coupled to the summing node to avoid slow recovery from an overdrive condition in the comparator mode.

42. A multimode amplifier stage as defined in claim 40, wherein the programmable feedback network comprises a resistance and a capacitive array and wherein the gain-stage is operable, in response to the mode control signal, in an integrator mode whereby the resistance is disconnected from the summing node and is operable, in response to mode control signal in a comparator mode whereby both the resistance and the capacitance are disconnected from the summing node.

43. A multimode amplifier stage as defined in claim 42, further comprising a clamp coupled to the interstage node, the clamp selectably conductive in response to the mode control signal to limit the voltage swing at the interstage node.

44. A multimode amplifier stage as defined in claim 39, wherein the amplifier stage is operable in an auto-cal mode whereby the output stage is disabled and the output of the input stage, at the interstage node, is coupled to a latching comparator.

45. A multimode amplifier stage as defined in claim 44, further comprising a nested Miller capacitance selectable coupled to the output stage.

46. A multimode amplifier stage as defined in claim 45, wherein the nested Miller capacitance is disconnected in the comparator mode.

47. A multimode amplifier stage as defined in claim 39, further comprising:
   a first clamp coupled to the summing node;
   a second clamp coupled to the interstage node; and
   a nested Miller capacitance selectably coupled to the second stage.

48. A multimode amplifier stage as defined in claim 47, wherein the mode control switch is operable in response to a mode control signal to cause the gain-stage to operate, alternatively, in a linear mode, a comparator mode, or an integrator mode.

49. A multimode amplifier stage as defined in claim 48, wherein the programmable feedback network comprises a resistance and a capacitive array and wherein the gain-stage is operable, in response to the mode control signal, in an integrator mode whereby the resistance is disconnected from the summing node and is operable, in response to mode control signal in a comparator mode whereby both the resistance and the capacitance are disconnected from the summing node.

50. A multimode amplifier stage as defined in claim 49, further comprising a clamp coupled to the interstage node, the clamp selectably conductive in response to the mode control signal to limit the voltage swing at the interstage node.

51. A multimode amplifier stage as defined in claim 48, wherein the amplifier stage is operable in an auto-cal mode whereby the output stage is disabled and the output of the input stage, at the interstage node, is coupled to a latching comparator.

52. A multimode amplifier stage as defined in claim 51, wherein the nested Miller capacitance is disconnected in the comparator mode.

53. A programmable gain stage comprising:
   an amplifier having a differential, current-mode input and a single-ended voltage-mode output;
   a programmable feedback network coupled to the amplifier input;
   a mode control input for receiving a mode control signal that determines the mode of operation of the gain stage; and
   a mode control switch coupled to the mode control input, the amplifier input and the feedback network.

54. A programmable gain stage as defined in claim 53, wherein the mode control switch comprises a semiconductor device coupled to the mode control input and coupled between the feedback network and the amplifier input.

55. A programmable gain stage as defined in claim 53, wherein the amplifier input comprises an inverting input and a noninverting input, and the semiconductor device is coupled between the feedback network and at least one of the inverting and noninverting inputs.

56. A multimode amplifier stage for an analog integrated circuit, the amplifier stage comprising:
   an input stage having a summing node;
   an output stage having an output node;
   an interstage node; and
   a mode control input for coupling to a mode control signal that determines the mode of operation of the amplifier stage,
   wherein the amplifier stage is operable in an auto-cal mode whereby the output stage is disabled and the output of the input stage, at the interstage node, is coupled to a latching comparator.

57. A multimode amplifier stage as defined in claim 56, including a programmable feedback network coupled between the output node and the summing node.

58. A multimode amplifier stage as defined in claim 57, including a mode control switch coupled to the summing node and to the programmable feedback network.

* * * * *